(12) United States Patent
Amagai et al.

(10) Patent No.: US 6,873,059 B2
(45) Date of Patent: Mar. 29, 2005

(54) SEMICONDUCTOR PACKAGE WITH METAL FOIL ATTACHMENT FILM

(75) Inventors: Masazumi Amagai, Oita (JP); Akira Karashima, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 10/008,049

(22) Filed: Nov. 13, 2001

(65) Prior Publication Data

US 2003/0092215 A1 May 15, 2003

(51) Int. Cl.$^7$ .............................................. H10L 29/40
(52) U.S. Cl. ..................................... 257/783; 257/782
(58) Field of Search ............................... 257/676, 707, 257/729, 743, 757

(56) References Cited

U.S. PATENT DOCUMENTS

| 6,166,433 A | | 12/2000 | Takashima et al. |
| 6,333,466 B1 | * | 12/2001 | Miyaake et al. ............ 174/254 |
| 6,376,769 B1 | * | 4/2002 | Chung ....................... 174/52.2 |

FOREIGN PATENT DOCUMENTS

| EP | 0751 561 A1 | 1/1997 |
| WO | WO 99 18609 A | 4/1999 |
| WO | WO 00 78887 A | 5/2002 |

OTHER PUBLICATIONS

Lamtec® Corporation; ARENASHIELD Foil/Fiberglass–Polyester Blend Fabric.
Lamtec® Corporation; GYMGUARD Polypropylene/Fiberglass–Polyester Blend Fabric.
STANDARD Suspension Fabric, "NEW" Std. Fabric for 2002, Simple Saver System®.
Purlin Glide™ Vapor Retarder Standard Duty (.02 Perm).

\* cited by examiner

*Primary Examiner*—Dung A. Le
(74) *Attorney, Agent, or Firm*—Frederick J. Telecky, Jr.; W. James Brady, III

(57) ABSTRACT

A semiconductor device comprising a semiconductor chip having an active and a passive surface, the passive surface adhesively attached to a substrate film by means of a multilayer composite; this composite comprising a metal foil having first and second surfaces and an adhesive layer attached on each of these surfaces. The multilayer composite has an average modulus larger than the modulus of the encapsulating molding compound used in the semiconductor device. By applying the composite to assembling face-up chip-scale devices, stress in solder joints is reduced and solder fatigue life enhanced.

16 Claims, 5 Drawing Sheets

SEMICONDUCTOR PACKAGE WITH METAL FOIL ATTACHMENT FILM

FIELD OF THE INVENTION

The present invention is related in general to the field of electronic systems and semiconductor devices, and more specifically to structure and fabrication methods of chip-scale packages which use a copper-based chip-attach material to reduce stresses in solder joints.

DESCRIPTION OF THE RELATED ART

One of the major trends in semiconductor packaging is the effort to shrink the package outline so that the package consumes less area and less height when it mounted onto the circuit board. Another powerful trend is the effort to achieve the outline reduction with minimum cost (both material and manufacturing cost). One of the most successful approaches has been the development of so-called "chip-scale packages". This expression is commonly used for packages which have an outline adding less than 20% to the chip area. A chip-scale package which has only the size of the chip itself is often referred to as "chip-size package".

For assembling an integrated circuit (I/C) chip in a chip-scale package, there are two options: In the so-called "face-up" assembly, the chip is assembled so that the "passive" surface is attached, by some adhesive, to a substrate while the "active" surface, embedded with the (IC) and its plurality of input/output (I/O) contact pads, is facing away from the substrate. In contrast, in the "face-down" assembly, the chip is assembled so that the "active" surface faces the substrate and is attached, usually by solder balls, to this substrate.

The "face-up" assembly requires an adhesive between chip and substrate which should exhibit a number of characteristics, which are in part difficult to combine:

The chip attach material, preferably an epoxy, should show tightly controllable "bleed-out" during chip attachment and little release of solvents ("outgassing") during polymerization (hardening).

After polymerization, the attach material should be hardened to a degree that it guarantees an almost immovable positioning of the chip during the wire bonding process at elevated temperatures.

The polymerized attach material should not change further during the subsequent transfer molding process and the molding material polymerization process at elevated temperatures and extended times.

Since the finished semiconductor device represents a system combining materials with different coefficients of thermal expansion (CTE), the attach material has to withstand the thermomechanical stresses, which naturally arise in this multi-material system during significant temperature variations.

After the semiconductor device is attached to an outside part such as a wiring board (usually by solder bumps), the chip attach material has to withstand the thermomechanical stresses between the device, the board attach material (solder bumps) and the board itself in temperature variations. These stresses are a natural consequence of the different CTE's of this assembled system. In reverse, the chip attach material should help to reduce thermomechanical stresses in solder joints in order to increase the solder fatigue life and thus increase the reliability of the device.

The attach material and the attach process should be low cost.

A number of different approaches for chip-scale device and package design, material selection and process conditions have been chosen by different semiconductor manufacturers for different market segments. A good overview of these approaches is presented in the book entitled "Chip Scale Package" by J. H. Lau and S. R. Lee (McGraw-Hill 1999). This overview shows that the latter two requirements listed above are particularly hard. to fulfill jointly.

An urgent need has, therefore, arisen for a coherent, low-cost concept and method of attaching IC chips to substrates. The concept and the fabrication method should further provide increased solder joint fatigue life expectancy. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

The present invention describes a semiconductor device comprising a semiconductor chip having an active and a passive surface, the passive surface adhesively attached to a substrate film by means of a multilayer composite; this composite comprising a metal foil having first and second surfaces and an adhesive layer attached on each of these surfaces. By applying this composite to assembling face-up chip-scale devices, stress in solder joints is reduced and solder fatigue life enhanced.

In a preferred embodiment, the multilayer composite consists of a copper foil (thickness range 30 to 150 $\mu$m) with a layer of epoxy resin/acrylic resin blend on each of its surfaces. The composite has an average modulus larger than the modulus of the encapsulating molding compound.

For a simple manufacturing process flow of the I/C chip attachment to the substrate film, the epoxy resin/acrylic resin layer facing the wafer support film (a wafer carrier) is ultra-violet sensitive (thickness range 20 to 50 $\mu$m). However, the epoxy resin/acrylic resin layer facing the passive chip surface is non-ultraviolet sensitive (thickness range 10 to 30 $\mu$m).

Solder joint fatigue studies based on Finite Element Modeling (FEM) showed a pronounced influence of the chip attach copper foil thickness on the board level reliability of device solder balls. As an example, for certain chip-scale devices, such as the Texas Instruments MicroStar™ Ball-Grid Array (BGA), a copper foil thickness of about 50 $\mu$m relieves the thermomechanical stress on solder balls so much that 800 temperature cycles of −40° C. to 125° C. can be passed with 1.0% failure rate. This result is equivalent to the one obtained for a hardened, epoxy-based chip attach material of about 100 $\mu$m thickness. Increasing the copper foil thickness to 75 $\mu$m pushes the board level reliability 1000 temperature cycles.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
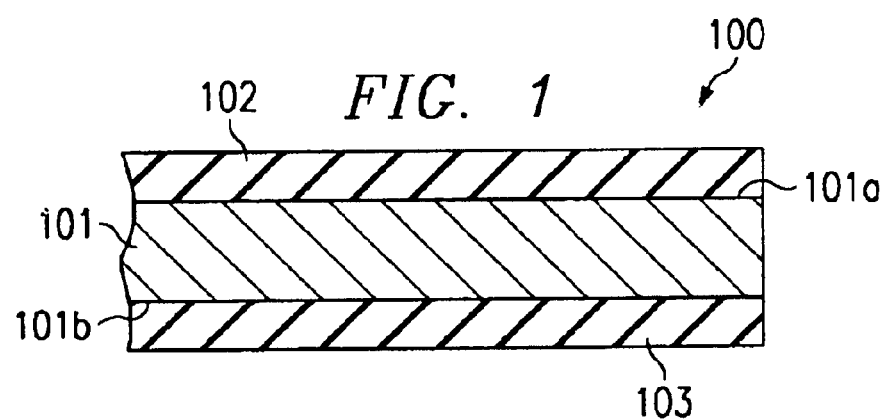
FIG. 1 is a simplified and schematic cross section of the multilayer composite attachment film according to this invention.

FIG. 1 is a schematic cross section of the multilayer composite attachment film, generally designated 100, for use in assembling a semiconductor chip onto a substrate. The metal foil 101 has first and second surfaces, designated 101a and 101b, respectively. An adhesive layer 102 is attached to surface 101a, and another adhesive layer 103 is attached on surface 101b. For the application of the present invention, the modulus of the chip attach material should be high enough to improve fatigue life of the solder joints of the chip-scale device. Specifically, the materials of metal foil 101 and adhesive layers 102 and 103 have to be selected so that the multilayer composite has an average modulus greater than the modulus of the polymerized encapsulation material employed to complete the assembly of the chip-scale semiconductor device. For molded packages fabricated with a filler-enriched epoxy molding compound, the modulus of the encapsulation material is approximately 20 to 26 GPa.

A preferred choice for metal foil 101 is copper in the thickness range from about 30 to 150 μm. When rolled copper is used, its elastic modulus in this thickness range is approximately 200 GPa; it has a fracture strength of about 44 MPa and an elongation capability of about 25%.

Figure 3:
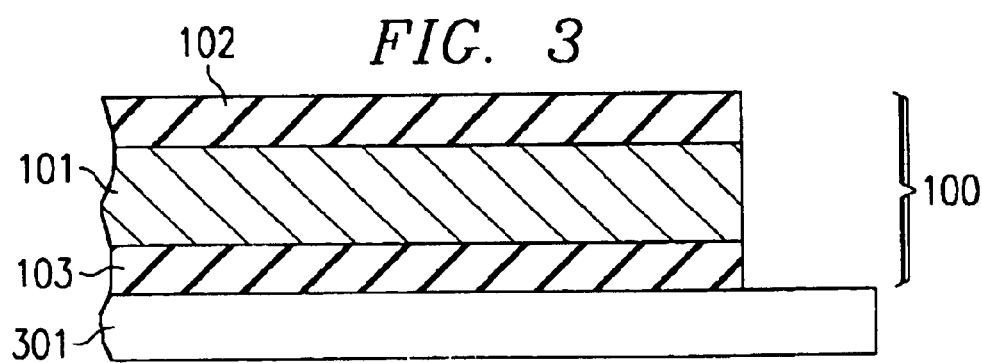
FIG. 3 shows a schematic cross section of the multilayer composite attachment film positioned on a support film.

The adhesive layers 102 and 103 are epoxy resin and acrylic resin blends with a modulus of about 1 GPa. Layer 102 is to be attached to the semiconductor chip and has a thickness preferably between 10 and 30μm. For the assembly process flow of the present invention, layer 102 should be non-ultraviolet (non-UV) curable. Layer 103 is to be attached to a substrate film and has a thickness preferably between 20 and 50μm. For the assembly process flow of the present invention, layer 103 has to be ultraviolet (UV) curable. The UV-curable epoxy resin and acrylic resin blend includes urethane resin, polyester, and ketonic resin. As usual, for semiconductor applications stringent purity requirements apply. Hot water extraction ion density values should indicate values for:

K: 0.12 ppm or less
Na: 0.40 ppm or less
NH4: 10.90 ppm or less
F: 1.70 ppm or less
Cl: 8.20 ppm or less The UV-adhesive layer has to serve two purposes: First, it needs to provide a secure positioning of the semiconductor wafer on a UV-transparent support film for the process step of wafer dicing (singulating discreet chips) with a saw. In an initial phase, the multilayer composite 100 is placed on the support film 301 with the UV-adhesive 103 resting on support film 103, as illustrated in FIG. 3. The support film 301, about 100 μm thick, contains PVC, PET, polypropylene, and other polymer building blocks. After completion of the wafer dicing step, the adhesive 103 is exposed to UV irradiation, which is directed from the outside through the transparent transport film 301. The radiation reduces the adhesive strength of the UV-sensitive adhesive. The discreet chips can then be lifted from the support film with a vacuum pen for transport to a substrate film.

Figure 4:
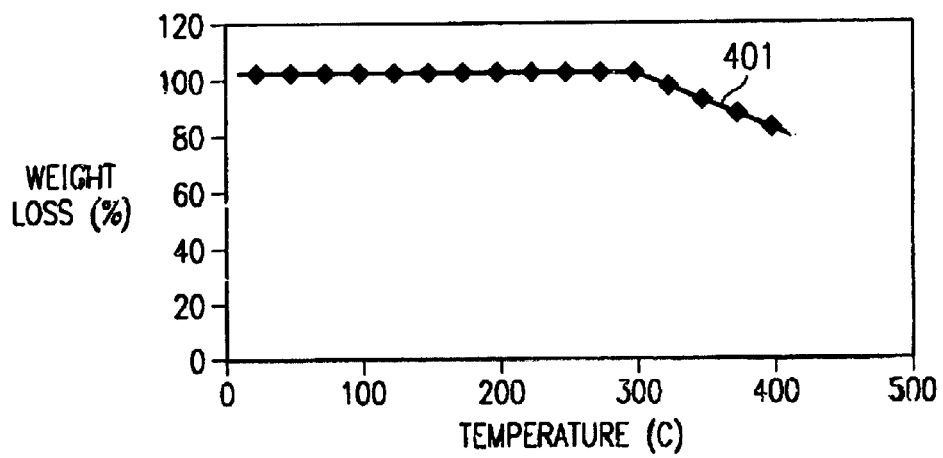
FIG. 4 is a graph of measured weight loss data of epoxy/acrylic blend resin (in %) as a function of temperature (in °C.).

The second purpose of the UV-adhesive is to provide permanent adhesion of the singulated chip to the substrate film, after the chip has been positioned onto the substrate. In order to stabilize this positioning, the adhesive has to be hardened by polymerization ("curing") For a typical epoxy/acrylic blend resin, FIG. 4 presents the weight loss (in %) due to outgassing during the polymerization of a typical epoxy/acrylic blend resin. Curve 401 indicates constant weight loss up to a temperature of about 300° C., and diminishing weight loses at higher temperatures. In this example, the curing was performed at 160° C. for 30 min at a temperature ramp of 5° C./min.

After this curing, a shear test may be performed to evaluate the shear adhesion strength between the chip and the substrate. In order to select unambiguous test conditions, it is practical to perform the test with a copper substrate, 300 μm thick. Examples of useful test conditions are: 100 g force applied to chip at 250° C. temperature, 30 s hold time (chip shear adhesion: is measured after epoxy/acrylic blend resin was cured at 160° C. for 30 min).

Figure 5:
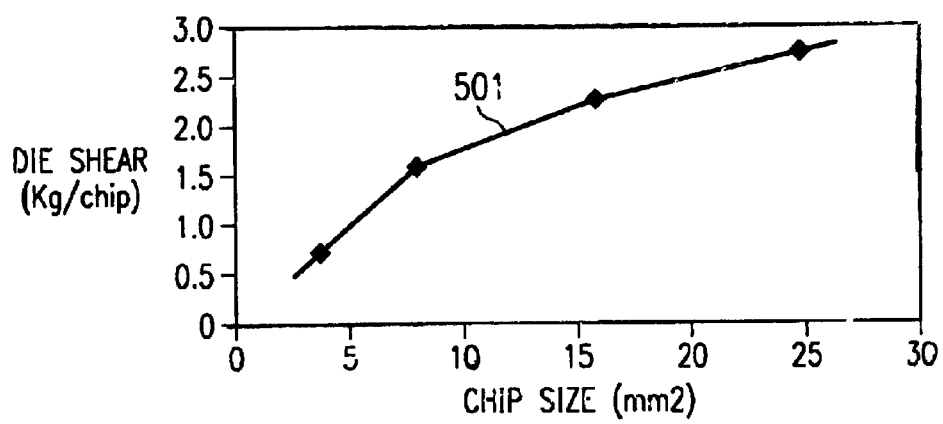
FIG. 5 is a graph of measured chip shear adhesion strength data (in kg/chip) as a function of chip size (in mm$^2$).
Figure 6:
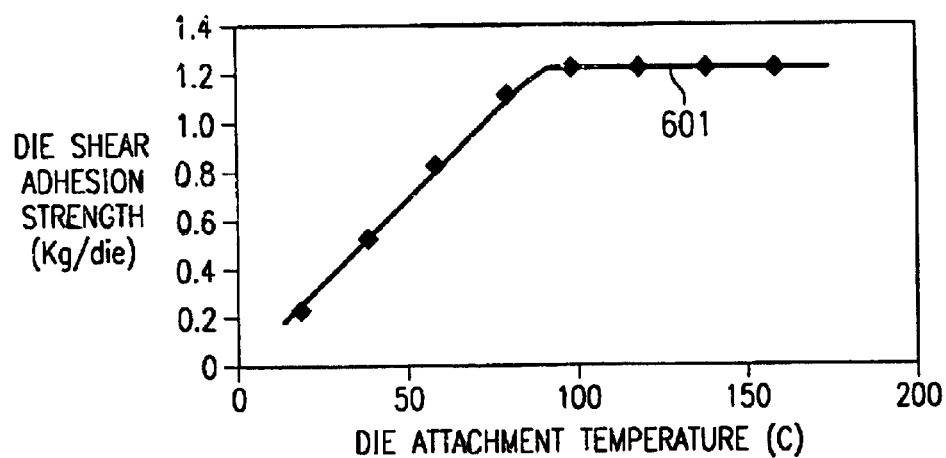
FIG. 6 is a graph of measured chip shear adhesion strength data (in kg/chip) as a function of the chip attachment temperature (in °C.).

Examples of acceptable results are displayed in FIGS. 5 and 6. In FIG. 5, the chip adhesion shear strength (in kg/chip) is plotted as a function of the chip size (in mm$^2$). As curve 501 indicates, the shear strength increases far less than linearly with chip size. In FIG. 6, the chip adhesion shear strength (in kg/chip) is plotted as a function of the chip attachment temperature (in °C.). As curve 601 indicates, the adhesion strength reaches a high, constant value only at an attachment temperature of approximately 100° C. or higher (for this investigation, a chip of 2×2 mm chip size was used; the chip attachment load was 100 g; the epoxy/acrylic blend resin was cured at 160° C. for 30 min).

Figure 2:
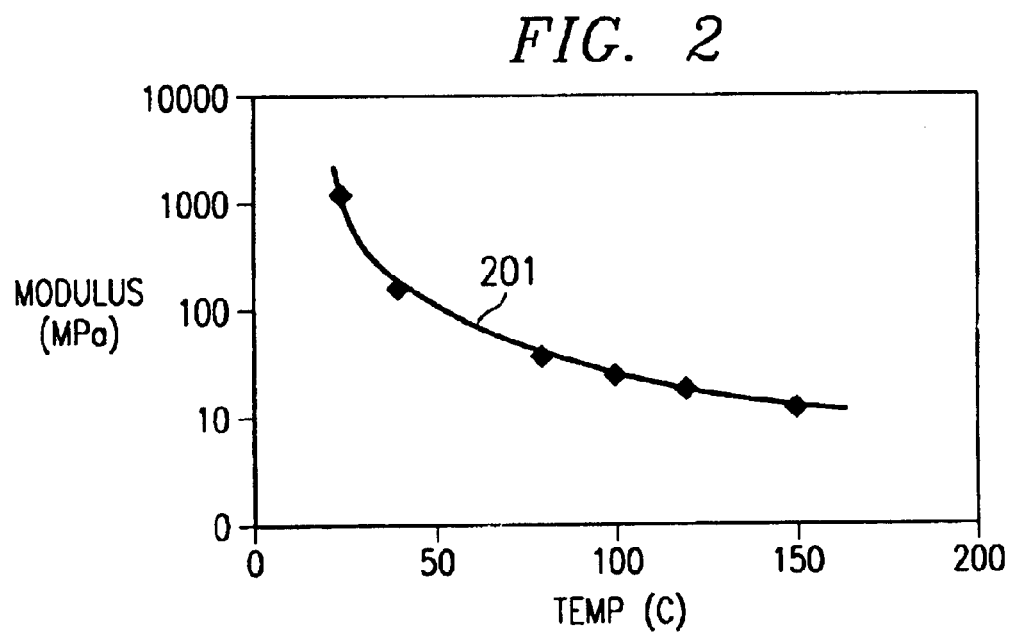
FIG. 2 is a graph of measured modulus data of epoxy/acrylic blend resin (in MPa) as a function of temperature (in °C.)

The modulus of the epoxy/acrylic blend resin is a strong function of temperature. As an example for a specific blend material, the modulus-temperature relation is shown in FIG. 2 by curve 201 for a testing frequency of 1.6 Hz and an increasing temperature ramp of 3° C./min. Note that in FIG. 2 the modulus is plotted on a logarithmic scale and the unit of the modulus numbers is MPa.

The average modulus Eav (in GPa) can be expressed by the following equation:

$$E\text{av}=(E\text{non-uv}\cdot A\text{non-uv}+E\text{cu }A\text{cu}+E\text{uv}\cdot A\text{uv})/A\text{tot};$$

where

Enon-uv is the modulus of the non-UV adhesive (in GPa);
Euv is the modulus of the UV adhesive (in GPa);
Ecu is the modulus of the copper foil (in GPa);
Anon-uv is the area (=length·width) of the non-UV adhesive (in mm$^2$);

Auv is the area (=length·width) of the UV adhesive (in mm²);
Acu is the area (=length·width) of the copper foil (in mm²).
Atot is the area (additive) of the multilayer composite (in mm²).

As an example, for the modulus data listed above for the copper foil (0.03 mm thickness, 200 GPa) and the two epoxy/acrylic blend resin layers (0.01 mm and 0.02 mm thickness respectively, 1 GPa) at a 6×6 mm area size, the average modulus is calculated as 100.5 GPA. This value is significantly higher than the 20 GPa determined for the molding compound used in the example chip-size package.

For a given area size, various combinations of copper foil thickness and adhesive thickness can be used in finite element modeling to study the tensile and shear strains in solder balls at various positions in the device, when the device is attached to a board and subjected to temperature cycling from −40 to 125° C. In order: to determine "board level reliability", the number of temperature cycles is monitored, at which the solder balls reach 1.0% creep (relaxation) failures, as a function of copper foil thickness. Of particular interest is a comparison of solder balls located under the chip and at the device package corners. As an example, a summary of these results is displayed in FIG. 7 for the following particular parameters of a preferred embodiment:

Molded chip scale ball grid array device such as TI Japan MicroStar BGA having a solder ball pitch of 0.5 mm
Chip size 6×6 mm
Copper foil of composite chip attach 6×6 mm size, thickness at various values from 25 to 100 μm
Chip attach material thickness 10 μm
Substrate thickness 50 μm, substrate via for solder ball 280 μm
Printed circuit board thickness 0.8 mm.

Figure 7:
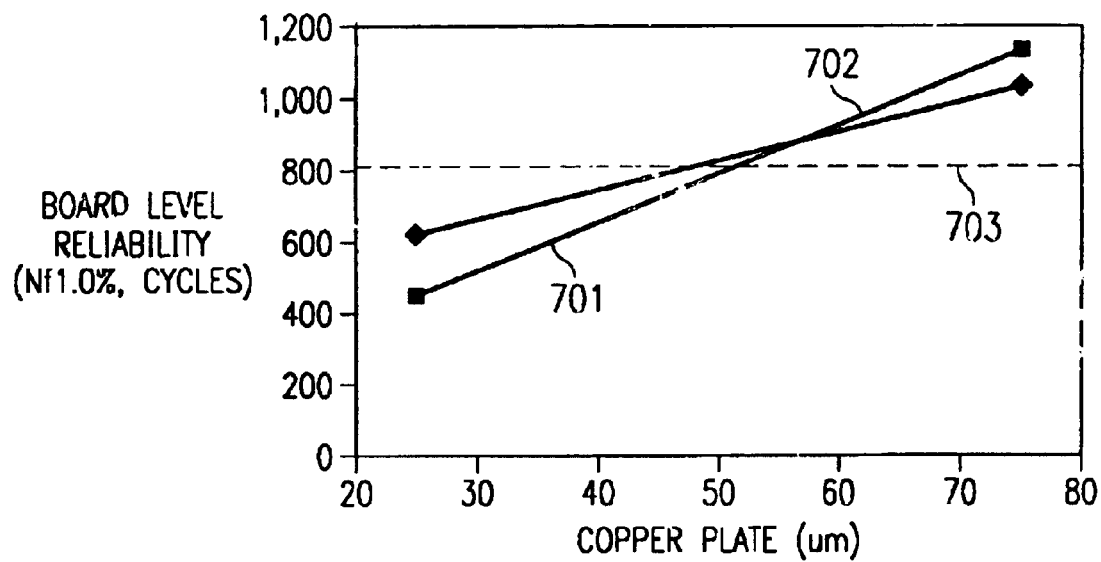
FIG. 7 illustrates the modeled relationship of board level reliability (in temperature cycles to 1.0% failure) of a chip-scale device having a chip attach material according to the invention as a function of the copper foil thickness (in μm) used in the attach material.

In FIG. 7, the number of temperature cycles (−40 to 125° C.) for 1% solder ball failure, as an indicator of board level reliability, is plotted as a function of the copper foil thickness (in μm) in the chip attach material. Curve 701 represents the behavior of the solder balls under the corner of the chip; curve 702 represents the behavior of the solder balls at the corner of the device package; curve 703 represents the behavior of the device when uniform 100 μm thick epoxy resin chip attach material is used (no copper).

The curves of FIG. 7 depict that for thin copper foils, the solder balls under the corner of the chip show earlier failure than the solder balls around the corner of the package. In contrast, for thick copper, the solder balls under the corner of the package show earlier failure than the solder balls under the chip. Curves 701, 702 and 703 indicate the important result that a device with a copper foil thickness of about 50 μm in the composite chip attach accomplishes a board level reliability performance similar to the device with a 100 μm thick epoxy-based chip attach paste. Furthermore, increasing the copper foil thickness to 75 μm may push the board level reliability to the level of 1000 temperature cycles before 1% failures are reached.

FIGS. 8 to 15 illustrate significant steps of the manufacturing process flow of the multilayer composite, the wafer assembly and the chip assembly to create a semiconductor device having a chip-scale package.

Figure 8:
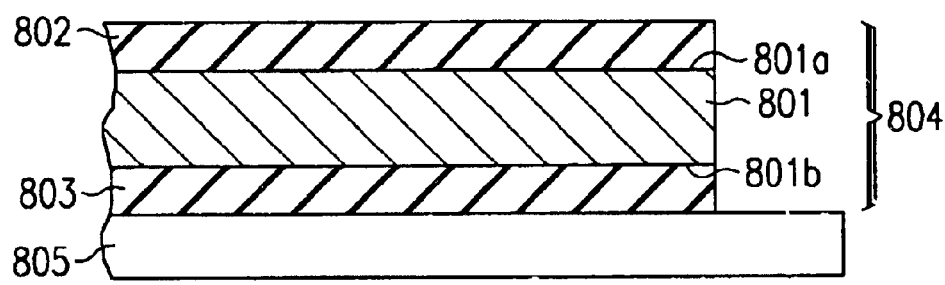
FIGS. 8 to 15 are schematic and simplified cross sections of the parts and successive stages in the assembly of a chip-scale device, when attach materials and methods are used according to the invention.
Figure 9:
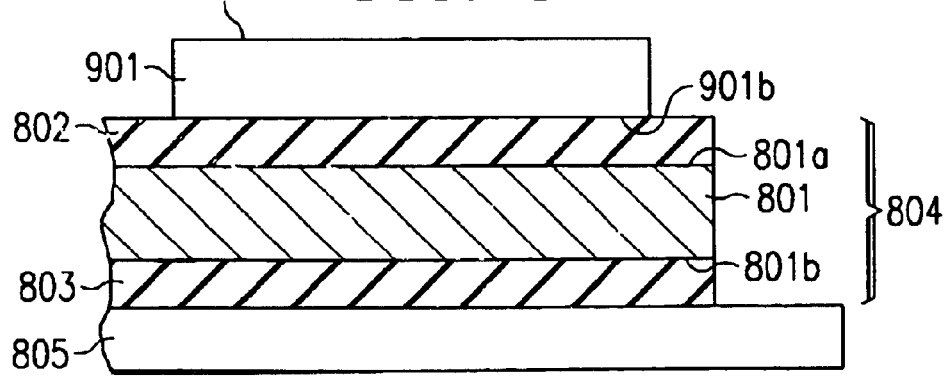
Figure 10:
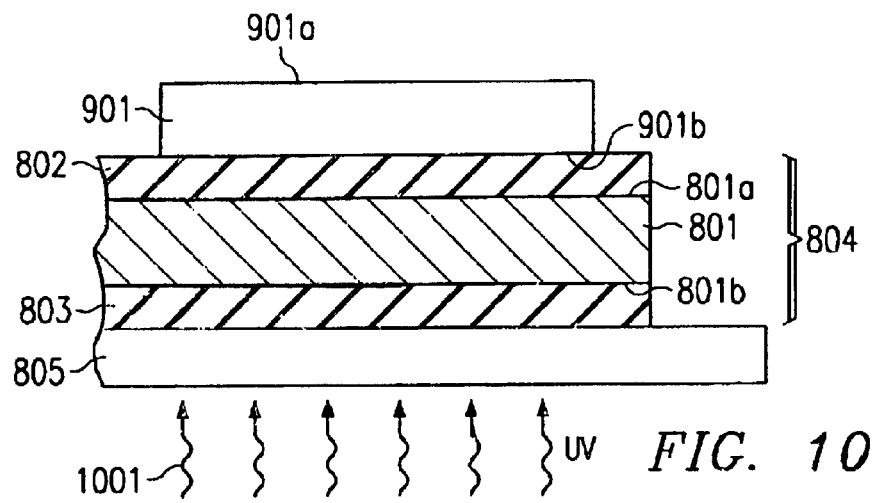

FIG. 8: Providing a metal foil 801 having first and second surfaces 801a and 801b, respectively;

attaching an adhesive layer on each of said surfaces; preferred method is attaching a non-UV curable adhesive layer 802 on metal surface 801a, and attaching an UV-curable adhesive layer 803 on metal surface 801b; thereby creating a multilayer composite 804 having an average modulus greater than the modulus of a polymerized device encapsulation material;

placing the composite film 804 with the UV-curable adhesive layer 803 onto a transparent support film 805;

FIG. 9: providing a semiconductor wafer 901 having an active surface 901a and a passive surface 901b;

attaching passive surface 901b of semiconductor wafer 901 onto the UV-curable adhesive layer 802 of the composite film 804; preferred chip attachment conditions are temperature 100° C. and higher, and force 100 g/chip;

FIG. 10: Shining ultraviolet light 1001 through the transparent support film 805 on the UV-curable adhesive film 803 in order to reduce the adhesive strength between the composite film 804 and the support film 805; preferred UV illumination intensity is about 120 mW/cM² and higher, UV luminous intensity about 70 to 200 mJ/cm²

Figure 11:
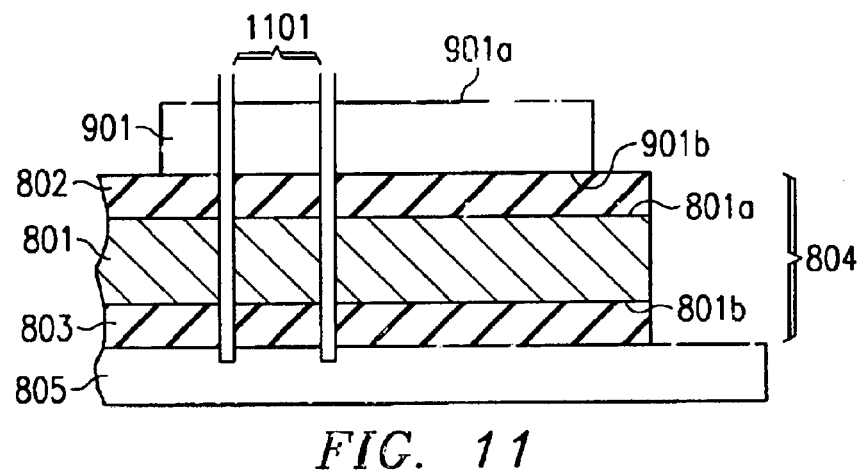
Figure 12:
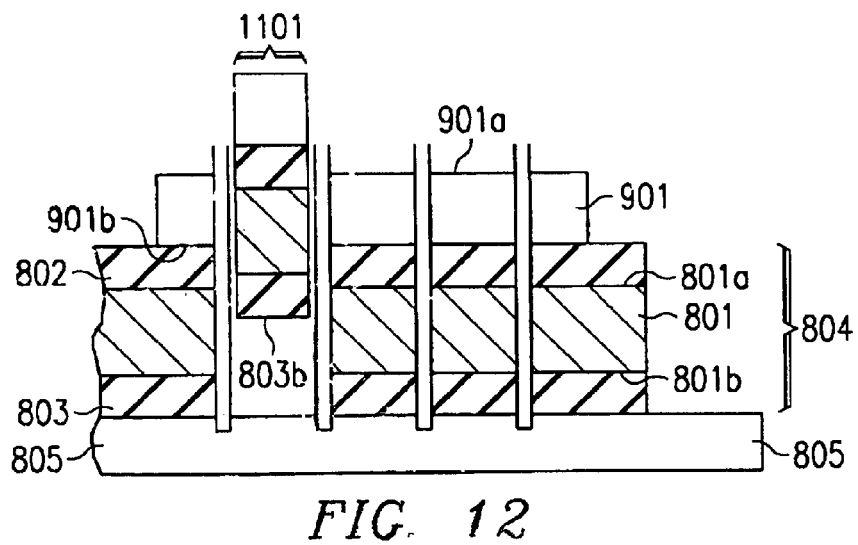
Figure 13:
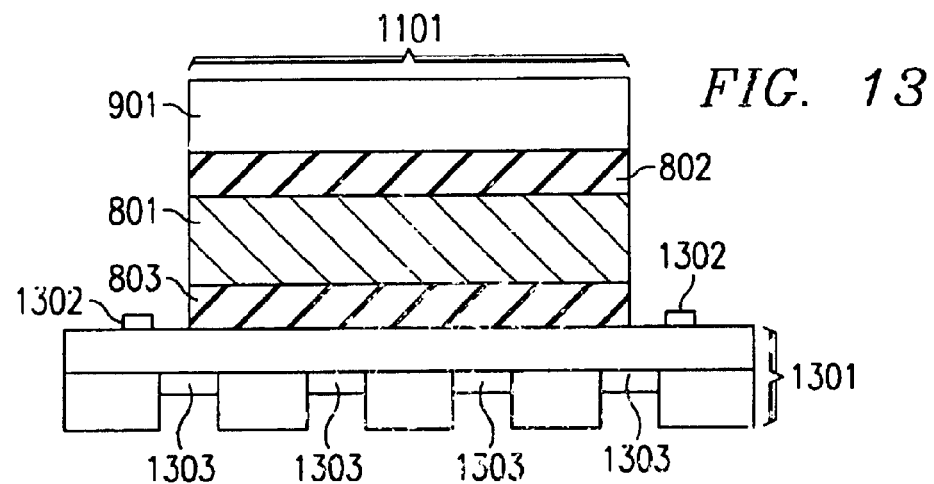
Figure 14:
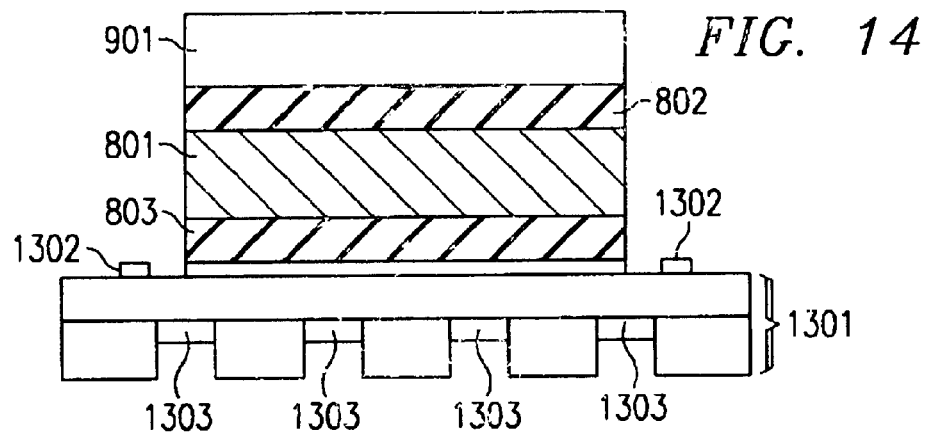
Figure 15:
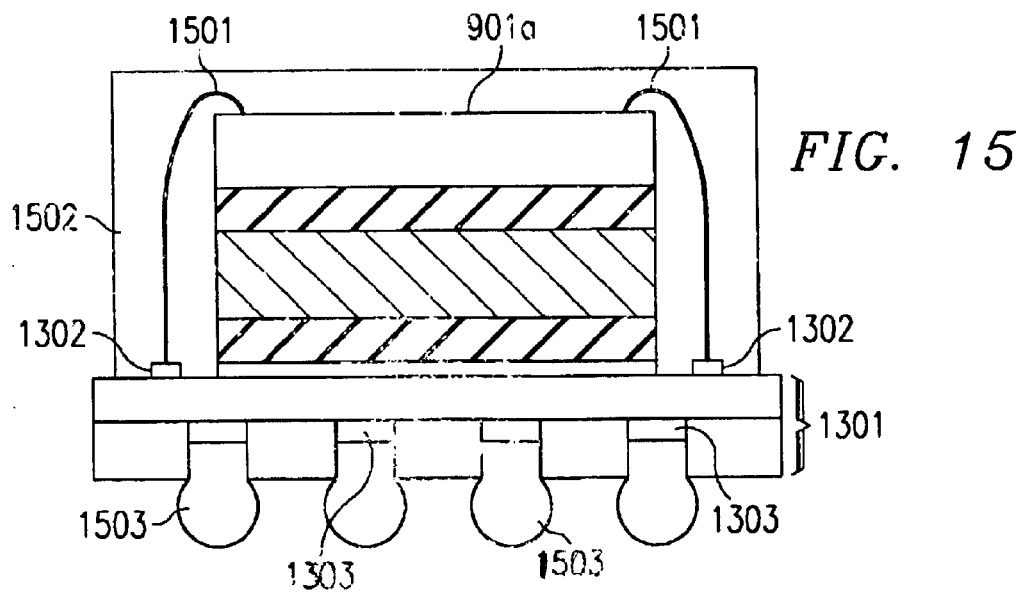

FIG. 11: Dicing wafer 901 and attached composite film 804 into singulated chips 1101;

FIG. 12: Lifting singulated chips 1101, one by one, from support film 805;

FIG. 13: Providing an insulating substrate film 1301, integral with electrically conductive routing lines, a first plurality 1302 of terminals on one surface of this substrate 1301, and a second plurality 1303 of terminals on the opposite surface of the substrate;

picking one singulated chip 1101 at a time from support film 805 and attaching the UV-cured surface 803b of each singulated chip (see also FIG. 12) to the substrate film 1301 (notice enlarged lateral scale in FIG. 13 compared to FIG. 12);

FIG. 14: Polymerizing ("curing") the adhesive layers 802 and 803, creating hardened layers;

FIG. 15: Wire bonding 1501 the active surface 901a of each chip to the first plurality 1302 of terminals on the substrate 1301, respectively;

encapsulating each chip in molding compound 1502 so that the active chip surface 901a, the bonding wires 1501, and portions of the substrate film 1301 are protected;

attaching solder balls 1503 to the second plurality 1303 of terminals on the substrate film 1301; and singulating the substrate film 1301 to create individual devices with outlines of chip-scale packages.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the semiconductor chip may be made from a material selected from a group consisting of silicon, silicon germanium, gallium arsenide, or any other semiconductor material used in integrated circuit fabrication.

As another example, the choice of the metal foil in the composite chip attach film may be any metal with a modulus so that the composite modulus is greater than the modulus of the selected molding compound. Examples include, but are not limited to, nickel, zinc and aluminum.

It is therefore intended that the appended claims encompass any such modifications or embodiments.

We claim:

1. A semiconductor device comprising:
   a semiconductor chip having an active and a passive surface, said passive surface adhesively attached to a substrate film by means of a multilayer composite;
   said composite comprising a metal foil having first and second surfaces and an adhesive layer attached on each of said surfaces.

2. The device according to claim 1 wherein said passive chip surface is attached to the adhesive on said first foil surface, and said substrate film attached to the adhesive on said second foil surface.

3. The device according to claim 2 wherein said adhesive layer between said chip and said first surface of said metal foil is between 10 and 30 µm thick, non-ultraviolet curable, and having a modulus of approximately 1 GPa.

4. The device according to claim 2 wherein said adhesive layer between said second surface of said metal foil and said support film is between 20 and 50 m thick, ultraviolet curable, and having a modulus of approximately 1 GPa.

5. The device according to claim 1 wherein, said substrate film is an insulator including polyimide in the thickness range of about 100 µm, integral with at least one layer of electrically conductive routing lines, a first plurality of terminals facing in the direction towards the chip, and a second plurality of terminals facing in the direction away from the chip.

6. The device according to claim 5 wherein said terminals are bondable or solderable.

7. The device according to claim 5 further comprising bonding wires attached to said first terminals and connecting said terminals to said active surface of said chip.

8. The device according to claim 5 further comprising solder balls attached to said second terminals, said solder balls suitable for connection to an outside part.

9. The device according to claim 7 further comprising a protective encapsulation, said encapsulation enclosing said active chip surface, said bonding wires, and portions of said first surface of said composite.

10. The device according to claim 9 wherein said encapsulation is provided by molding compound, having a modulus of approximately 20 to 26 GPa.

11. The device according to claim 1 wherein said multilayer composite has an average modulus larger than the modulus of the encapsulating molding compound.

12. The device according to claim 1 wherein said semiconductor chip is made from a material selected from a group consisting of silicon, silicon germanium, gallium arsenide, and any other semiconductor material used in integrated circuit fabrication.

13. A semiconductor device comprising:
    a semiconductor chip having an active and a passive surface:
    a composite attachment film comprising a metal foil having first and second surfaces and an adhesive layer on each of said surfaces of said metal layer; said passive surface of said chip attached to said adhesive layer on said first surface of said metal foil; and
    a substrate; herein said adhesive layer on said second surface of said metal foil is attached to said substrate.

14. The device of claim 13, further comprising bonding wires attaching said active surface of said chip to said substrate.

15. The device of claim 14, further comprising encapsulant enclosing said active surface of said chip, said bonding wires, and at least a portion of said substrate.

16. The device of claim 15, wherein the average modulus of elasticity of the composite attachment film is higher than the modulus of elasticity of said encapsulant.

* * * * *